United States Patent
Ishii

(10) Patent No.: US 10,186,501 B2
(45) Date of Patent: Jan. 22, 2019

(54) ELECTRIC POWER CONVERTER AND POWER MODULE

(71) Applicant: Mitsubishi Electric Corporation, Tokyo (JP)

(72) Inventor: Ryuichi Ishii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 330 days.

(21) Appl. No.: 14/915,662

(22) PCT Filed: Dec. 24, 2013

(86) PCT No.: PCT/JP2013/084494
§ 371 (c)(1),
(2) Date: Mar. 1, 2016

(87) PCT Pub. No.: WO2015/097748
PCT Pub. Date: Jul. 2, 2015

(65) Prior Publication Data
US 2016/0225750 A1    Aug. 4, 2016

(51) Int. Cl.
*H01L 25/18* (2006.01)
*H01L 23/49* (2006.01)
(Continued)

(52) U.S. Cl.
CPC .......... *H01L 25/18* (2013.01); *H01L 23/3107* (2013.01); *H01L 23/3675* (2013.01);
(Continued)

(58) Field of Classification Search
CPC ....... H01L 25/18; H01L 25/07; H01L 25/072; H01L 23/31; H01L 23/31; H01L 23/3107;
(Continued)

(56) References Cited

U.S. PATENT DOCUMENTS

2002/0060356 A1    5/2002  Nishibori et al.
2014/0054762 A1*   2/2014  Nagaune ............... H01L 23/473
                                                         257/714
(Continued)

FOREIGN PATENT DOCUMENTS

CN            1354510 A       6/2002
JP         2002-158328 A      5/2002
(Continued)

OTHER PUBLICATIONS

Communication dated Feb. 14, 2017, from the Japanese Patent Office in counterpart Application No. 2015-554329.
(Continued)

*Primary Examiner* — Monica D Harrison
(74) *Attorney, Agent, or Firm* — Sughrue Mion, PLLC; Richard C. Turner

(57) ABSTRACT

An electric power converter includes a switching device that performs electric-power conversion through switching, an insulated substrate having a first side and a second side that are opposite to each other, a first circuit with which the switching device is electrically connected and that is bonded to the first side of the insulated substrate, a second circuit that is formed in a shape the same as that of the first circuit and is bonded to the second side of the insulated substrate, and a base to which the second circuit is bonded through the intermediary of a bonding layer; each of corner portions in the respective planar shapes of the first circuit and the second circuit has a stress relaxation portion that is formed in such a way as to have a smaller thickness than the other portion.

7 Claims, 3 Drawing Sheets

(51) Int. Cl.
| | |
|---|---|
| *H01L 23/473* | (2006.01) |
| *H01L 25/07* | (2006.01) |
| *H02M 7/00* | (2006.01) |
| *H01L 23/31* | (2006.01) |
| *H01L 23/367* | (2006.01) |
| *H01L 23/498* | (2006.01) |
| *H01L 23/373* | (2006.01) |
| *H01L 23/053* | (2006.01) |

(52) U.S. Cl.
CPC ...... *H01L 23/473* (2013.01); *H01L 23/49838* (2013.01); *H01L 25/072* (2013.01); *H02M 7/003* (2013.01); *H01L 23/053* (2013.01); *H01L 23/3121* (2013.01); *H01L 23/3735* (2013.01); *H01L 2924/0002* (2013.01)

(58) Field of Classification Search
CPC ... H01L 23/36; H01L 23/367; H01L 23/3675; H01L 23/47; H01L 23/473; H01L 23/49; H01L 23/498; H01L 23/4983; H01L 23/49838
USPC .......................................................... 257/714
See application file for complete search history.

(56) References Cited

U.S. PATENT DOCUMENTS

| | | | |
|---|---|---|---|
| 2014/0332951 | A1 | 11/2014 | Nakamura et al. |
| 2016/0027711 | A1* | 1/2016 | Harada ................... H01L 25/07 |
| | | | 257/698 |

FOREIGN PATENT DOCUMENTS

| | | | |
|---|---|---|---|
| JP | 2003-101277 | A | 4/2003 |
| JP | 2006-004961 | A | 1/2006 |
| JP | 2010-69503 | A | 4/2010 |
| WO | 2013/118478 | A1 | 8/2013 |

OTHER PUBLICATIONS

Communication dated Dec. 4, 2017, issued by State Intellectual Property Office of People's Republic of China in counterpart Chinese Application No. 201380081825.4.
International Search Report for PCT/JP2013/084494 dated Mar. 11, 2014.
Communication dated Jul. 26, 2016 from the Japanese Patent Office in counterpart application No. 2015-554329.

* cited by examiner

ELECTRIC POWER CONVERTER AND POWER MODULE

CROSS REFERENCE TO RELATED APPLICATIONS

This application is a National Stage of International Application No. PCT/JP2013/084494 filed Dec. 24, 2013, the contents of all of which are incorporated herein by reference in their entirety.

TECHNICAL FIELD

The present invention relates to an electric power converter, for a vehicle or the like, that is mounted in a traveling body such as an automobile, and to a power module to be utilized in the electric power converter or the like.

BACKGROUND ART

As is well known, an electric power converter to be mounted in a vehicle or the like is provided with an inverter circuit that performs DC/Ac electric-power conversion between a DC power source such as a vehicle battery and an AC rotating machine for driving a vehicle or the like. This inverter circuit is configured with a plurality of switching devices that are each formed of a power semiconductor element such as an IGBT (Insulated Gate Bipolar Transistor); in general, along with respective free-wheel diodes connected in parallel therewith, these switching devices are mounted on a first circuit provided on a first side of an insulated substrate (e.g., a side that is, in general, referred to as the "top side" or the "front side" of an insulated substrate).

The insulated substrate has the first circuit connected with the switching devices and the free-wheel diodes and a second circuit provided on a second side (e.g., a side that is, in general, referred to as the "bottom side" or the "rear side" of an insulated substrate), which is the side opposite to the first side. In general, the switching devices, the free-wheel diodes, and the insulated substrate are integrally molded with a resin and are provided as a monolithic component, which is referred to as a so-called power module.

In general, with regard to the foregoing power module, the second circuit on the insulated substrate is bonded to a first side of a metal base (e.g., a side that is, in general, referred to as the "top side" or the "front side" of a metal base) through the intermediary of a bonding layer formed through soldering or the like. A fin enclosed with a cover is provided on a second side, which is the side opposite to the first side, of the metal base (e.g., a side that is, in general, referred to as the "bottom side" or the "rear side" of a metal base); while making direct contact with a cooling fluid such as water that flows in the cover, the fin is cooled. As a result, the thermal resistance of a heat conductive path departing from the switching devices and the free-wheel diodes, which are heating elements, and reaching the cooling fluid by way of the metal base and the fin is reduced.

In an electric power converter disclosed in Patent Document 1, the second circuit that has been provided on the second side of the insulated substrate in the power module is omitted and the insulated substrate is bonded to a low-rigidity and soft metal base with a fin, so that the thermal resistance is reduced and the high reliability is obtained.

PRIOR ART REFERENCE

Patent Document

[Patent Document 1] Japanese Patent Application Laid-Open No. 2006-4961

DISCLOSURE OF THE INVENTION

Problems to be Solved by the Invention

The insulated substrate in the power module of the foregoing conventional electric power converter is formed of, for example, a ceramic silicon nitride, an aluminum nitride, or the like and is bonded, by means of soldering or the like, to the first side of the metal base formed of copper, aluminum, or the like. In contrast, due to the switching operation of the switching devices, the power module alternately repeats heating and cooling; therefore, the materials in the power module repeat linear expansion in accordance with the respective linear-expansion coefficients thereof. In general, the respective linear-expansion coefficients of metal such as copper or aluminum that forms a metal base and a ceramic silicon nitride or an aluminum nitride that forms an insulated substrate significantly differ from each other. Accordingly, a maximal thermal distortion is caused in the bonding layer that is formed through soldering or the like and bonds the metal base and the insulated substrate to each other. The first and second circuits provided on the insulated substrate are each formed of metal such as copper or aluminum and are thin and low-rigidity; therefore, the first and second circuits hardly provide an effect to the linear expansion of the insulated substrate.

In order to secure the reliability of the bonding layer for the thermal distortion or the like caused by soldering or the like, the strength of the high-rigidity metal base need to be reduced or the rigidity of the insulated substrate needs to be raised by thickening the first circuit and the second circuit provided on the insulated substrate; however, in the case where the strength of the metal base is reduced, the vibration resistance is deteriorated and hence there has been a problem that the insufficient strength of the metal base unable the electric power converter to withstand vibration of the vehicle; in contrast, in the case where the circuits on the insulated substrate are thickened, there has been a problem that stresses produced in the bonding portions at the four corners of the respective circuits cause cracks in the insulated substance.

The present invention has been implemented in order to solve the foregoing problems in conventional electric power converters; the objective thereof is to provide high-reliability electric power converter and power module that reduce thermal distortion in a bonding layer for bonding a base in an electric power converter with a circuit bonded to an insulated substrate and can secure the vibration resistance.

Means for Solving the Problems

An electric power converter according to the present invention performs electric-power conversion between DC electric power and AC electric power; the electric power converter includes a switching device that performs the electric-power conversion through switching, an insulated substrate having a first side and a second side that are opposite to each other, a first circuit with which the switching device is electrically connected and that is bonded to the first side of the insulated substrate, a second circuit that is formed in a shape the same as that of the first circuit and is bonded to the second side of the insulated substrate, and a base to which the second circuit is bonded through the intermediary of a bonding layer; the electric power converter is characterized in that each of corner portions in the respective planar shapes of the first circuit and the second circuit has a stress relaxation portion that is formed in such a way as to have a smaller thickness than the other portion.

An electric power converter according to the present invention performs electric-power conversion between DC electric power and AC electric power; the electric power converter includes a switching device that performs the electric-power conversion through switching, an insulated substrate having a first side and a second side that are opposite to each other, a first circuit with which the switching device is electrically connected and that is bonded to the first side of the insulated substrate, a second circuit that is formed in a shape the same as that of the first circuit and is bonded to the second side of the insulated substrate, and a first base having a recess, a second base that has a first side and a second side that is opposite to the first side, bonded to the first base, and covers an opening portion of the recess, a fin that is provided on the second side of the second base and is contained in the recess, and a bonding layer that bonds the second circuit to the first side of the second base; the electric power converter is characterized in that the recess is included in at least part of a cooling fluid flow path through which a cooling fluid for cooling the fin flows, in that the second base has a smaller thickness than the first base, and in that each of corner portions in the respective planar shapes of the first circuit and the second circuit has a stress relaxation portion that is formed in such a way as to have a smaller thickness than the other portion.

Furthermore, a power module according to the present invention is utilized in an electric power converter that performs electric-power conversion between DC electric power and AC electric power; the power module includes a switching device that performs switching operation, an insulated substrate having a first side and a second side that are opposite to each other, a first circuit with which the switching device is electrically connected and that is bonded to the first side of the insulated substrate, a second circuit that is formed in a shape the same as that of the first circuit and is bonded to the second side of the insulated substrate, and a resin with which the switching device, the insulated substrate, the first circuit, and the second circuit are integrally molded; the power module is characterized in that each of corner portions in the respective planar shapes of the first circuit and the second circuit has a stress relaxation portion that is formed in such a way as to have a smaller thickness than the other portion.

Advantage of the Invention

An electric power converter according to the present invention includes a switching device that performs electric-power conversion through switching, an insulated substrate having a first side and a second side that are opposite to each other, a first circuit with which the switching device is electrically connected and that is bonded to the first side of the insulated substrate, a second circuit that is formed in a shape the same as that of the first circuit and is bonded to the second side of the insulated substrate, and a base to which the second circuit is bonded through the intermediary of a bonding layer; each of corner portions in the respective planar shapes of the first circuit and the second circuit has a stress relaxation portion that is formed in such a way as to have a smaller thickness than the other portion. As a result, it is made possible to obtain a high-reliability electric power converter that can not only relax the thermal distortion in the bonding layer for bonding the second circuit to the base in the electric power converter but also secure the vibration resistance.

An electric power converter according to the present invention includes a switching device that performs electric-power conversion through switching, an insulated substrate having a first side and a second side that are opposite to each other, a first circuit with which the switching device is electrically connected and that is bonded to the first side of the insulated substrate, a second circuit that is formed in a shape the same as that of the first circuit and is bonded to the second side of the insulated substrate, a first base having a recess, a second base that has a first side and a second side that is opposite to the first side, bonded to the first base, and covers an opening portion of the recess, a fin that is provided on the second side of the second base and is contained in the recess, and a bonding layer that bonds the second circuit to the first side of the second base; the recess is included in at least part of a cooling fluid flow path through which a cooling fluid for cooling the fin flows; the second base has a smaller thickness than the first base; each of corner portions in the respective planar shapes of the first circuit and the second circuit has a stress relaxation portion that is formed in such a way as to have a smaller thickness than the other portion. As a result, it is made possible to obtain a high-reliability electric power converter that can not only relax the thermal distortion in the bonding layer for bonding the second circuit to the base in the electric power converter but also secure the vibration resistance.

Furthermore, a power module according to the present invention includes a switching device that performs switching operation, an insulated substrate having a first side and a second side that are opposite to each other, a first circuit with which the switching device is electrically connected and that is bonded to the first side of the insulated substrate, a second circuit that is formed in a shape the same as that of the first circuit and is bonded to the second side of the insulated substrate, and a resin with which the switching device, the insulated substrate, the first circuit, and the second circuit are integrally molded; each of corner portions in the respective planar shapes of the first circuit and the second circuit has a stress relaxation portion that is formed in such a way as to have a smaller thickness than the other portion. As a result, in the case where the power module is applied to an electric power converter, it is made possible to obtain a high-reliability electric power converter that can not only relax the thermal distortion in the bonding layer for bonding the second circuit of the power module to the base in the electric power converter but also secure the vibration resistance.

BEST MODE FOR CARRYING OUT THE INVENTION

Electric Power Converter that is a Basis of the Present Invention

Figure 5:
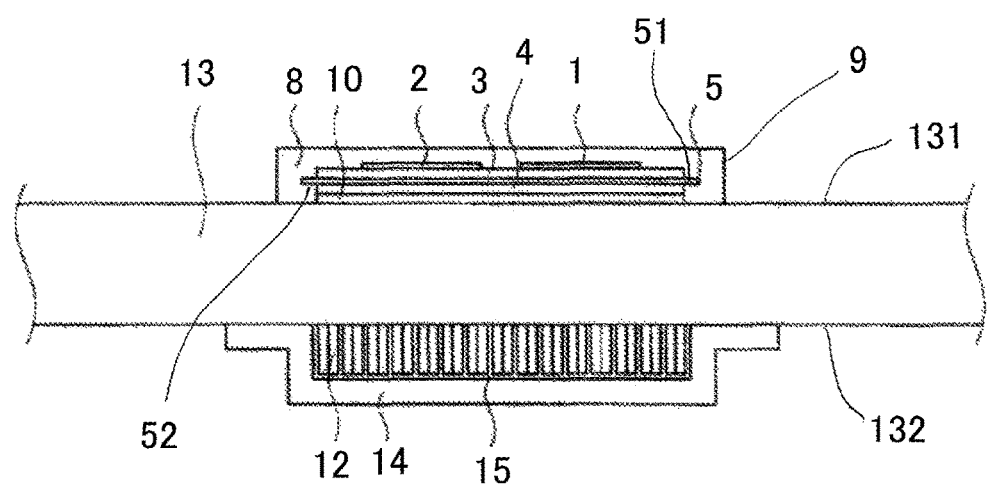
FIG. 5 is a cross-sectional view illustrating an electric power converter and a power module, which are the bases of the present invention.

At first, for the sake of better understanding of an electric power converter and a power module according to the present invention, the electric power converter and the power module that are the bases of the present invention will be explained. FIG. 5 is a cross-sectional view of an electric power converter and a power module, which are the bases of the present invention. In FIG. 5, a switching device 1 formed of a power semiconductor element such as an IGBT and a free-wheel diode 2 connected in parallel with the switching device 1 are mounted, through soldering, in a first circuit 3 provided on a first side 51 (corresponding to the "top side", in FIG. 5) of an insulated substrate 5.

A second circuit 4 provided on a second side 52 (corresponding to the "bottom side" or the "rear side", in FIG. 5) of the insulated substrate 5 is bonded to a first side 131 (corresponding to the "top side", in FIG. 5) of a metal base 13 through the intermediary of a bonding layer 10 formed through soldering. A metal fin 12 is integrally molded with or bonded to a second side 132 (corresponding to the "bottom side" or the "rear side", in FIG. 5) of the metal base 13. A cover 14 is fixed to the second side 132 of the metal base 13 and encloses the fin 12 in a liquid-tight manner.

A cooling fluid flow path 15 in which a cooling fluid such as water flows is formed inside the cover 14. The fin 12 enclosed by the cover 14 makes direct contact with the cooling fluid flowing in the cooling fluid flow path 15, so that the fin 12 is cooled. As described above, the fin 12 is directly cooled by the cooling fluid; thus, the thermal resistance from the switching device 1 and the free-wheel diode 2 to the cooling fluid is reduced. The insulated substrate 5 and switching device 1, the free-wheel diode 2, the first circuit 3, and the second circuit 4 that are provided on the insulated substrate 5 are integrally molded with a resin 8 so as to form a discrete power module 9.

The insulated substrate 5 in the power module of the electric power converter, which is illustrated in FIG. 5 and is the basis of the present invention, is formed of, for example, a ceramic silicon nitride, an aluminum nitride, or the like and is bonded, through the intermediary of the bonding layer 10 formed through soldering or the like, to the first side 131 of the metal base 13 formed of copper, aluminum, or the like. In contrast, due to the switching operation of the switching device 1, the power module alternately repeats heating and cooling; therefore, the materials in the power module repeat linear expansion in accordance with the respective linear-expansion coefficients thereof.

As described above, the respective linear-expansion coefficients of metal such as copper or aluminum that forms the metal base 13 and a ceramic silicon nitride or an aluminum nitride that forms the insulated substrate 5 significantly differ from each other. Accordingly, a maximal thermal distortion is caused in the bonding layer 10 that is formed through soldering or the like and bonds the metal base 13 and the insulated substrate to each other. The first circuit 3 and the second circuit 4 provided on the insulated substrate 5 are each formed of metal such as copper or aluminum and are thin and low-rigidity; therefore, the first circuit 3 and the second circuit 4 hardly provide an effect to the linear expansion of the insulated substrate 5.

Embodiment 1

Figure 1:
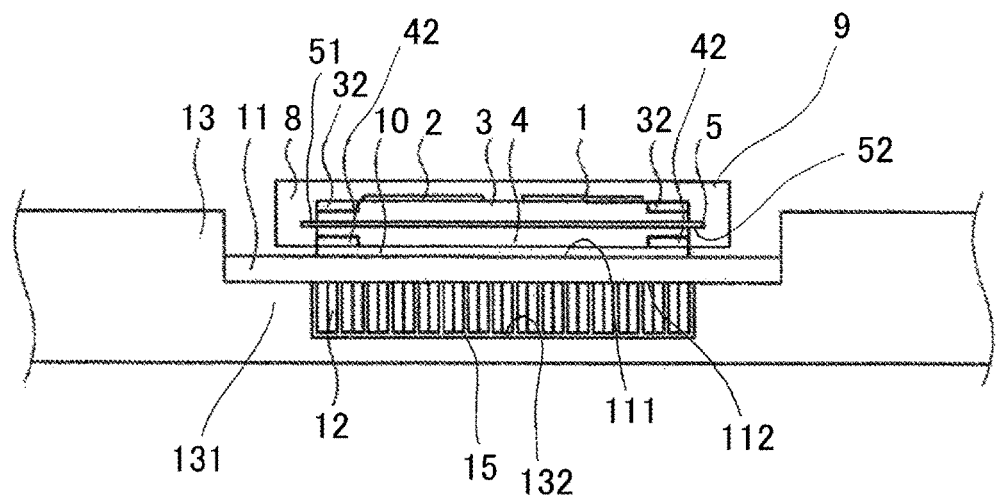
FIG. 1 is a cross-sectional view illustrating an electric power converter and a power module according to Embodiment 1 of the present invention.

Next, an electric power converter and a power module according to Embodiment 1 of the present invention will be explained. FIG. 1 is a cross-sectional view illustrating an electric power converter and a power module according to Embodiment 1 of the present invention. In FIG. 1, an insulated substrate 5 is formed of a silicon nitride or an aluminum nitride; an after-mentioned first circuit 3, which is formed of copper and has a thickness of approximately 1 [mm], is bonded through brazing to a first side 51 (corresponding to the "top side", in FIG. 1) of the insulated substrate 5. A second circuit 4, which is formed of copper and has a thickness of approximately 1 [mm], is bonded through brazing to a second side 52 (corresponding to the "bottom side" or the "rear side", in FIG. 1) of the insulated substrate 5.

A switching device 1 formed of a power semiconductor element such as an IGBT and a free-wheel diode 2 connected in parallel with the switching device 1 are bonded through soldering or sintering to and electrically connected with the first circuit 3 on the insulated substrate 5. The second circuit 4 provided on the second side 52 of the insulated substrate 5 is bonded to, through the intermediary of a bonding layer 10 formed through soldering or sintering, and electrically connected with a first side 111 (corresponding to the "top side", in FIG. 1) of a second base 11 fixed to a small-thickness portion 131 of a first base 13 formed of metal such as copper or aluminum. The insulated substrate 5 and switching device 1, the free-wheel diode 2, the first circuit 3, and the second circuit 4 that are provided on the insulated substrate 5 are integrally molded with a resin 8 so as to form a discrete power module 9.

The second base 11 is formed of metal such as copper or aluminum and has a thickness smaller than that of the first base 13 that has a large thickness; for example, the second base 11 is formed in such a way as to have a thickness of approximately several millimeters. A fin 12 is integrally molded with or bonded to a second side 112 (corresponding to the "bottom side" or the "rear side", in FIG. 1) of the second base 11. A recess 132 is formed in the small-thickness portion 131 of the first base 13; the fin 12 provided on the second side 112 of the second base 11 is contained in the recess 132 of the first base 13 through the intermediary of a gap therebetween.

The recess 132 of the first base 13 is sealed in a liquid-tight manner by the second base 11 so as to form a cooling fluid flow path through which a cooling fluid such as water flows. While making direct contact with the cooling fluid that flows through the cooling fluid flow path 15, the fin 12 is cooled. As described above, the fin 12 is directly cooled by the cooling fluid; thus, the thermal resistance from the switching device 1, the free-wheel diode 2, and the second base 11 to the cooling fluid is reduced.

Figure 2:
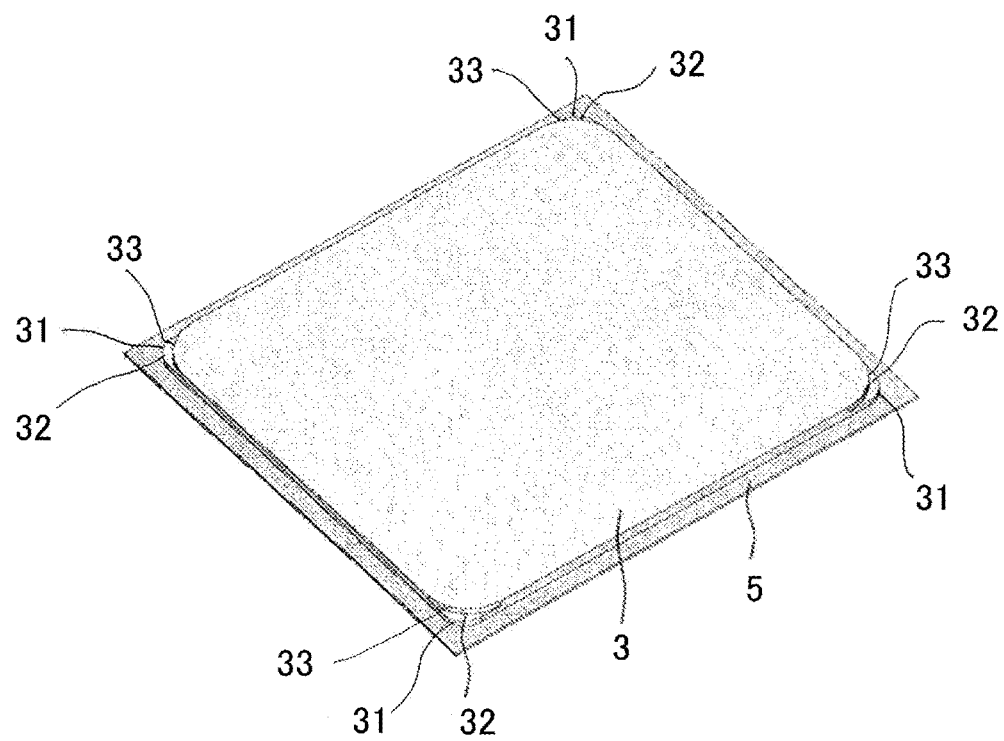
FIG. 2 is a perspective view illustrating an insulated substrate and a first circuit of the power module in the electric power converter according to Embodiment 1 of the present invention.

Next, the respective configurations of the first circuit 3 and the second circuit 4 will be explained. FIG. 2 is a perspective view illustrating the insulated substrate and the first circuit in the electric power converter according to Embodiment 1 of the present invention. In FIG. 2, each of the four corner portions of the first circuit 3 bonded through brazing to the first side 51 of the insulated substrate 5 is formed in the shape of an arc; at the respective portions corresponding to the corner portions, there are provided stress relaxation portions 32 that are each formed of a level-difference portion whose thickness is smaller than that of the other portion. In Embodiment 1, in each of the stress relaxation portion 32 of the first circuit 3, an inner arc 33 thereof is formed in such a way as to have a curvature radius larger than that of an outer radius 31 thereof. The second circuit 4 is formed in such a way as to have a shape the same as that of the first circuit 3 and has, at the four corner portions thereof, respective stress relaxation portions 42 that each have a shape the same as that of the stress relaxation portion 32 of the first circuit 3.

It is desirable that in order to reduce the thermal resistance of the power module, the first circuit 3 and the second circuit 4 are formed of copper that is superior to aluminum in termed of heat transfer; in general, because the insulated substrate 5 is more fragile than metal, the first circuit 3 and the second circuit 4 are each formed of a thin copper having a thickness of approximately 0.3 [mm]. However, by providing the stress relaxation portions 32 of the first circuit 3 and the stress relaxation portions 42 of the second circuit 4, the stresses produced at the four corners of each of the first circuit 3 and the second circuit 4 can be reduced, even when the respective thicknesses of the first circuit 3 and the second circuit 4 are enlarged up to approximately 0.8 [mm].

In the case where the respective shapes of the first circuit 3 and the second circuit 4 are the same as each other and the respective shapes of the stress relaxation portion 32 of the first circuit 3 and the stress relaxation portion 42 of the second circuit 4 are the same as each other, the stress produced by the distortion toward the first side 51 of the insulated substrate 5 and the stress produced by the distortion toward the second side 52 thereof cancel out each other so that the stress can be suppressed from occurring. As a result, it is made possible to enlarge the linear expansion of the whole insulated substrate 5 without making any crack occur in the insulated substrate 5; therefore, the thermal distortion that occurs in the bonding layer 10 can be reduced. Moreover, because the insulated substrate 5 is sealed with the resin 8, the linear expansion of the insulated substrate 5 can be enlarged and hence the thermal distortion in the bonding layer 10 can be reduced.

Figure 3:
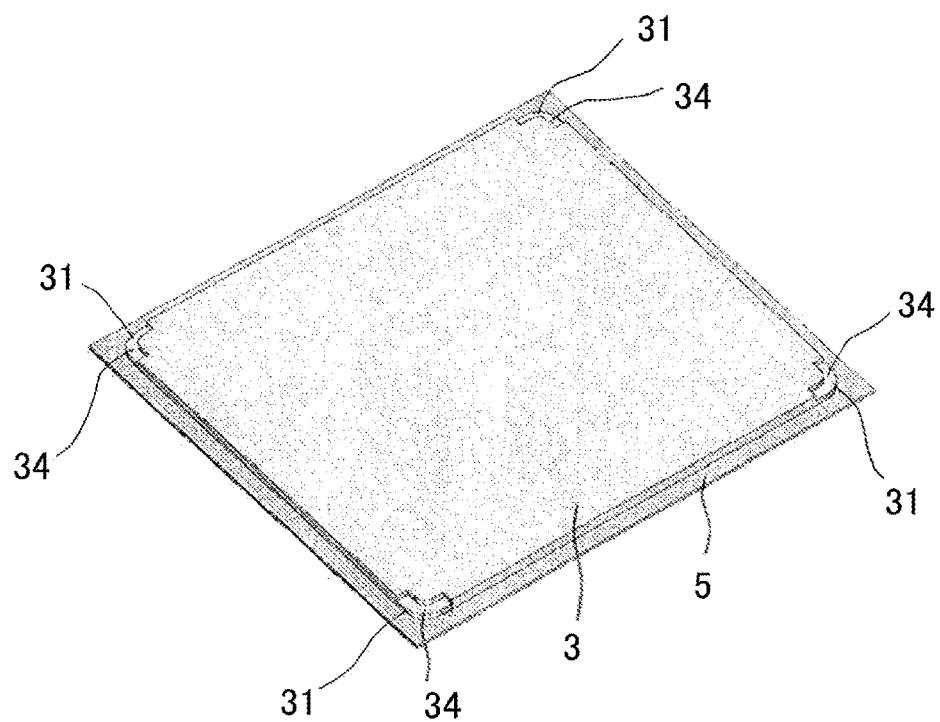
FIG. 3 is a perspective view illustrating respective variant examples of the insulated substrate and the first circuit of the power module in the electric power converter according to Embodiment 1 of the present invention.

Adjustment of the shape, the size, and the depth of the level difference in the stress relaxation portion 32 of the first circuit 3 and the shape, the size, and the depth of the level difference in the stress relaxation portion 42 of the second circuit 4 can further reduce the thermal distortion. That is to say, FIG. 3 is a perspective view illustrating variant examples of the insulated substrate and the first circuit in the electric power converter according to Embodiment 1 of the present invention. A stress relaxation portion 34 of a first circuit 3 illustrated in FIG. 3 is formed of a step portion that is in the shape of a sector having an almost constant width. Although not illustrated, a second circuit 4 is formed in such a way as to have a shape the same as that of the first circuit 3 and has stress relaxation portions that each have a shape the same as that of the stress relaxation portion 34 of the first circuit 3.

Figure 4:
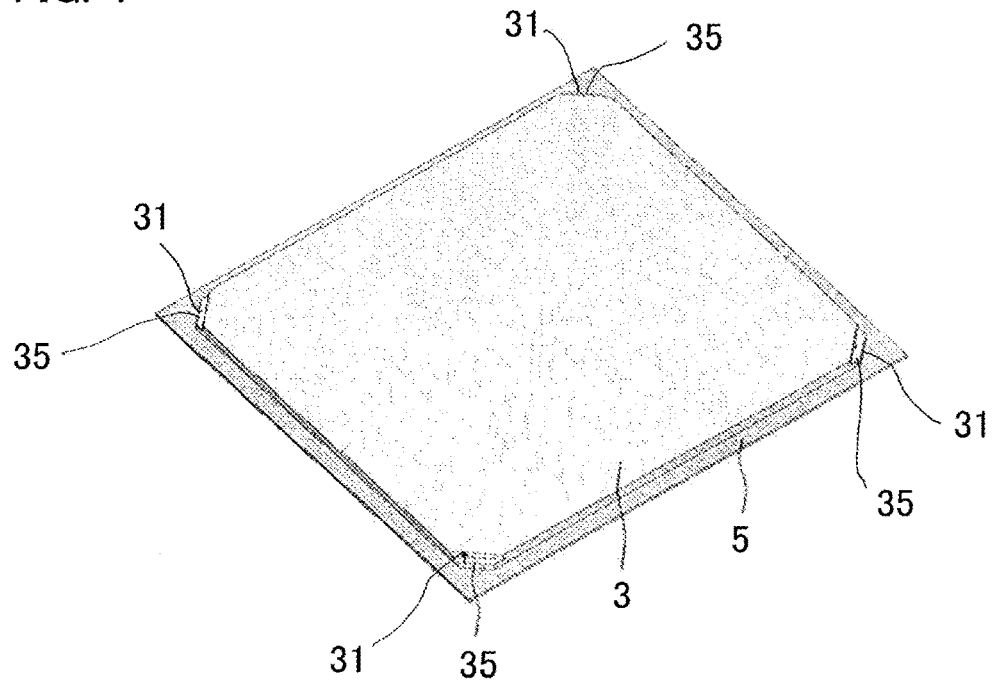
FIG. 4 is a perspective view illustrating another variant example of each of the insulated substrate and the first circuit of the power module in the electric power converter according to Embodiment 1 of the present invention.

FIG. 4 is a perspective view illustrating another variant example of each of the insulated substrate and the first circuit in the electric power converter according to Embodiment 1 of the present invention. Stress relaxation portions 35 of a first circuit 3 illustrated in FIG. 4 are formed of respective step portions, at the four corners of the first circuit 3, that each extend at an angle of approximately 45° with respect to the corresponding side edge. Although not illustrated, a second circuit 4 is formed in such a way as to have a shape the same as that of the first circuit 3 and has stress relaxation portions that each have a shape the same as that of the stress relaxation portion 35 of the first circuit 3.

As described above, by setting the thickness of the second base 11 to several millimeters, the rigidity of the second base 11 can be decreased and hence the thermal distortion in the bonding layer 10 can be reduced. By fixing the second base 11 having a small rigidity to the first base 13 having a large rigidity, by means of welding, friction stir joining, or by use of a screw, the vibration resistance of the electric power converter can be raised, so that it is made possible to secure the vibration resistance while relaxing the thermal distortion in the bonding layer 10.

In general, the inverter is configured with several power modules configured in such a manner as described above; therefore, in the case where the positions of bonding between the second base 11 and the first base 13 having a rigidity larger than that of the second base 11 are provided not only at the peripheral portions of the recess 132, as illustrated in FIG. 2, but also at the position between the second base 11 between neighboring power modules and the middle portion, in the transverse-direction of the recesses 132, of the first base 13, the vibration resistance can further be raised.

In the case where in Embodiment 1 described above, the second circuit 4 of the power module is connected after the second base 11 and the first base 13 having a high-rigidity are bonded with each other, the connection work is performed after the size and the shape have been determined, and hence the facilities become large and complicated; therefore, especially, in the case of connection through soldering, the heat capacity becomes large and hence the bonding becomes extremely difficult; however, in the case where the connection between the second base 11 and the second circuit 4 of the power module is firstly performed, the workability can remarkably be raised and hence it is made possible to select a high-reliability connection method.

In the scope of the present invention, the embodiments thereof can appropriately be modified or omitted.

INDUSTRIAL APPLICABILITY

The present invention can be applied, for example, to the field of an electric power converter for a hybrid automobile and eventually, to the field of a vehicle such as an automobile.

DESCRIPTION OF REFERENCE NUMERALS

1: switching device
2: free-wheel diode
3: 1st circuit
4: 2nd circuit
5: insulated substrate
32, 34, 35, 42: stress relaxation portion
8: resin
9: power module
10: bonding layer
11: 2nd base
13: 1st base
12: fin
14: cover
15: cooling fluid flow path
131: small-thickness portion
132: recess

The invention claimed is:

1. An electric power converter that performs electric-power conversion between direct current (DC) electric power and alternating current (AC) electric power, the electric power converter comprising:
   a switching device that performs the electric-power conversion through switching;
   an insulated substrate having a first side and a second side that are opposite to each other;
   a first circuit with which the switching device is electrically connected and that is bonded to the first side of the insulated substrate;
   a second circuit that has a same shape as the first circuit and is bonded to the second side of the insulated substrate; and
   a base to which the second circuit is bonded through a bonding layer,
   wherein a thickness of each corner portion of the first circuit and the second circuit is less than a thickness of center portions of the first circuit and second circuit, to thereby form stress relaxation portions.

2. The electric power converter according to claim 1, wherein the switching device, the insulated substrate, the first circuit, and the second circuit are included in a power module in which they are integrally molded with a resin.

3. An electric power converter that performs electric-power conversion between direct current (DC) electric power and alternating current (AC) electric power, the electric power converter comprising:
   a switching device that performs the electric-power conversion through switching;
   an insulated substrate having a first side and a second side that are opposite to each other;
   a first circuit with which the switching device is electrically connected and that is bonded to the first side of the insulated substrate;
   a second circuit that has a same shape as the first circuit and is bonded to the second side of the insulated substrate;
   a first base having a recess;
   a second base that has a first side and a second side that is opposite to the first side, bonded to the first base, and covers an opening portion of the recess;
   a fin that is provided on the second side of the second base and is contained in the recess; and
   a bonding layer that bonds the second circuit to the first side of the second base,
   wherein the recess is included in at least part of a cooling fluid flow path through which a cooling fluid for cooling the fin flows,
   wherein the second base has a smaller thickness than the first base, and
   wherein each of corner portions in the respective planar shapes of the first circuit and the second circuit has a stress relaxation portion that is formed in such a way as to have a smaller thickness than any other portion of the first circuit and the second circuit.

4. The electric power converter according to claim 3, wherein the switching device, the insulated substrate, the first circuit, and the second circuit are included in a power module in which they are integrally molded with a resin.

5. The electric power converter according to claim 3, wherein the switching device, the insulated substrate, the first circuit, and the second circuit are included in a power module in which they are integrally molded with a resin, and
   wherein after the second circuit of the power module is bonded to the second base through the intermediary of the bonding layer, the second base is bonded to the first base.

6. The electric power converter according to claim 3, wherein the first base has a small-thickness portion whose thickness is smaller than thickness of any other portion of the first base,
   wherein the recess is formed in the small-thickness portion of the first base, and
   wherein the second base is bonded to the small-thickness portion of the first base.

7. A power module utilized in an electric power converter that performs electric-power conversion between direct current (DC) electric power and alternating current (AC) electric power, the power module comprising:
   a switching device that performs switching operation;
   an insulated substrate having a first side and a second side that are opposite to each other;
   a first circuit with which the switching device is electrically connected and that is bonded to the first side of the insulated substrate;
   a second circuit that has a same shape as the first circuit and is bonded to the second side of the insulated substrate; and
   a resin with which the switching device, the insulated substrate, the first circuit, and the second circuit are integrally molded,
   wherein a thickness of each corner portion of the first circuit and the second circuit is less than a thickness of center portions of the first circuit and the second circuit, to thereby form stress relaxation portions.

* * * * *